(12) United States Patent
Javey et al.

(10) Patent No.: US 8,697,467 B2
(45) Date of Patent: Apr. 15, 2014

(54) SURFACE AND GAS PHASE DOPING OF III-V SEMICONDUCTORS

(75) Inventors: Ali Javey, Fremont, CA (US);
Alexandra C. Ford, Albany, CA (US);
Johnny C. Ho, Hong Kong (HK)

(73) Assignee: The Regents of the University of California, Oakland, CA (US)

( * ) Notice: Subject to any disclaimer, the term of this patent is extended or adjusted under 35 U.S.C. 154(b) by 134 days.

(21) Appl. No.: 12/843,271

(22) Filed: Jul. 26, 2010

(65) Prior Publication Data

US 2012/0018702 A1    Jan. 26, 2012

(51) Int. Cl.
*H01L 29/00*    (2006.01)

(52) U.S. Cl.
USPC ............... 438/46; 438/77; 438/483; 438/93; 438/518; 438/572; 257/E21.459

(58) Field of Classification Search
USPC ................. 438/46, 77, 93, 483, 518, 572; 257/E21.459
See application file for complete search history.

(56) References Cited

U.S. PATENT DOCUMENTS

| | | | |
|---|---|---|---|
| 5,384,269 A * | 1/1995 | Cho | 438/522 |
| 7,253,119 B2 * | 8/2007 | Dutta | 438/754 |
| 2007/0272990 A1 * | 11/2007 | Kim et al. | 257/410 |
| 2008/0227259 A1 * | 9/2008 | Avouris et al. | 438/301 |
| 2009/0050876 A1 * | 2/2009 | Marks et al. | 257/24 |
| 2010/0015738 A1 * | 1/2010 | Kim | 438/26 |

OTHER PUBLICATIONS

Ford et al., "Synthesis, Contact Printing, and Device Characterization of Ni-Catalyzed, Crystalline InAs Nanowires," Nano Research (2008) 1: 32-39.
Ford et al., "Patterned p-Doping of InAs Nanowires by Gas-Phase Surface Diffusion of Zn," Nano Letters 2010 vol. 10, pp. 509-513.
Ho et al., "Controlled nanoscale doping of semiconductors via molecular monolayers," Nature Materials, Jan. 2008, vol. 7, pp. 62-67.
Ho et al., "Nanoscale doping of InAs via sulfur monolayers," Applied Physics Letters (2009) 95: 072108.
Ho et al., "Wafer-Scale, Sub-5 nm Junction Formation by Monolayer Doping and Conventional Spike Annealing," Nano Letters 2009, vol. 9, No. 2, pp. 725-730.

* cited by examiner

*Primary Examiner* — Elias M Ullah
(74) *Attorney, Agent, or Firm* — Saliwanchik, Lloyd & Eisenschenk

(57) ABSTRACT

Compound semiconductor devices and methods of doping compound semiconductors are provided. Embodiments of the invention provide post-deposition (or post-growth) doping of compound semiconductors, enabling nanoscale compound semiconductor devices including diodes and transistors. In one method, a self-limiting monolayer technique with an annealing step is used to form shallow junctions. By forming a sulfur monolayer on a surface of an InAs substrate and performing a thermal annealing to drive the sulfur into the InAs substrate, n-type doping for InAs-based devices can be achieved. The monolayer can be formed by surface chemistry reactions or a gas phase deposition of the dopant. In another method, a gas-phase technique with surface diffusion is used to form doped regions. By performing gas-phase surface diffusion of Zn into InAs, p-type doping for InAs-based devices can be achieved. Both bulk and nanowire devices using compound semiconductors can be fabricated using these surface and gas-phase doping processes.

17 Claims, 15 Drawing Sheets

SURFACE AND GAS PHASE DOPING OF III-V SEMICONDUCTORS

This invention was made with government support under Contract No. HR0011-07-3-0002 awarded by DARPA and Grant No. 0826145 awarded by the National Science Foundation. The U.S. Government has rights in this invention.

BACKGROUND OF THE INVENTION

As transistor dimensions continue to shrink in order to increase density and performance, existing device structures and materials are reaching the threshold for many desirable device characteristics. To this end, new materials for existing device structures and novel transistor structures are being explored.

In recent years, III-V compound semiconductors, such as indium arsenide (InAs), gallium arsenide (GaAs), and their alloy indium gallium arsenide (InGaAs), have become materials of interest for the future active channel materials of metal-oxide-semiconductor field-effect transistors (MOSFETs) and as materials for transistors with nanowire (NW) channels.

III-V compound semiconductors are drawing interest because of their superior electron mobilities. However, since the device processing requirements are significantly different from elemental semiconductors such as silicon (Si), III-V compound semiconductors impose a major challenge on nanoscale III-V device fabrication. Among the many challenges, controlling the post-growth dopant profiles in III-V compound semiconductors deterministically has not been well addressed. In the Si industry, ion implantation has been the dominant doping technique for decades. This process, however, presents problems for compound semiconductors, which consist of two or more chemically and electronically nonequivalent lattice sites. Specifically, the stoichiometry can be altered and difficult to recover from implantation induced crystal damage. The residual damage can lead to higher junction leakage and lower dopant activation in compound semiconductors.

For example, much research has been devoted to transistors with nanowire (NW) channels due to their excellent electrostatic properties. Because of its high electron mobility and ease of nanoscale, metal ohmic contact formation to the conduction band via solid source reactions, InAs is emerging as a promising semiconductor for NW devices. However, there remain many challenges to be addressed with InAs NW device fabrication. Specifically, one fabrication issue that requires attention is the dopant profiling of InAs NWs. P-type doping of InAs NWs is particularly challenging given the surface electron-rich layer that causes the surface Fermi level to be pinned in the conduction band for an undoped NW. Although techniques such as in-situ doping during the growth have been previously reported for NWs, post-growth patterned doping is desired for most device fabrication schemes. As with other compound semiconductors, conventional ion-implantation techniques are not compatible with nanoscale InAs semiconductors due to the severe crystal damage induced during the implantation process resulting in In atom clustering, which cannot be fixed by a subsequent annealing process.

Accordingly, there continues to be a need in the art for techniques to control the post-growth dopant profiles in III-V compound semiconductors.

BRIEF SUMMARY

The invention provides III-V semiconductor devices and methods of doping III-V semiconductors. Embodiments of the invention provide post-deposition (or post-growth) doping of compound semiconductors. In accordance with an embodiment of the invention, planar and non-planar devices based on III-V materials, even III-V compound semiconductors not compatible with conventional ion implantation processes, can be fabricated.

In accordance with one embodiment of the invention, III-V compound semiconductor based device structures, including $p^+$-$n^+$ diodes, $p^+$-n diodes, n-MOSFETs and p-MOSFETs are provided.

Methods are provided for surface doping of compound semiconductors, where dopants are introduced onto a surface of a compound semiconductor and are diffused into the compound semiconductor.

According to one embodiment, a method of doping III-V semiconductors includes a self-limiting monolayer technique. In a specific embodiment, n-type junction regions on III-V semiconductor substrates with high dopant areal dose and uniformity are formed through nanoscale sulfur n-doping using a self-limiting monolayer doping approach. According to one method, an ammonium sulfide treatment is applied to a compound semiconductor substrate to form a monolayer of sulfur on the surface of the compound semiconductor substrate; an oxide cap is formed on the substrate having the monolayer of sulfur and a thermal annealing process is performed to drive the sulfur into the substrate to a desired junction depth. The oxide cap can then be removed from all or portions of the substrate. In a specific embodiment, the compound semiconductor includes InAs. A similar method can be used to form p-type junction regions on III-V semiconductor substrates.

According to another embodiment, a method of doping III-V semiconductors includes a gas-phase technique. In a specific embodiment, p-type junction regions on MN semiconductor substrates are formed through nanoscale zinc p-doping using a gas-phase approach. For example, compound semiconductor nanowires (NWs) can be formed and selectively doped p-type by forming an oxide mask exposing a portion of a NW to be made p-type and performing Zn gas-phase doping through surface diffusion. The undoped portion of the NW (for as-grown NW exhibiting n-type characteristics) and the doped portion of the NW provide a P-N junction. A similar method can be used to form n-type junction regions on III-V semiconductor substrates and NWs.

BRIEF DESCRIPTION OF THE DRAWINGS

FIGS. 6A and 6B show low and high resolution transmission electron microscopy (TEM) images, respectively, showing $SiO_2$/S-doped InAs interfaces; FIG. 6C shows a plot of energy dispersive x-ray spectroscopy (EDS) chemical profiles of In, As, and S across the junction interface: and FIG. 6D shows a secondary ion mass spectroscopy (SIMS) profile of S in InAs, indicating a profile abruptness of ~3.5 nm/decade near the doped surface region.

DETAILED DISCLOSURE

Compound semiconductor devices and methods of doping compound semiconductors are provided. Embodiments of the invention provide post-deposition (or post-growth) doping of compound semiconductors, enabling nanoscale compound semiconductor devices including diodes and transistors. In accordance with embodiments of the invention, methods are provided for surface doping of compound semiconductors, where dopants are introduced onto a surface of a compound semiconductor and are diffused into the compound semiconductor. In one method, a self-limiting monolayer technique with an annealing step is used to form shallow junctions. In another method, a gas-phase technique with surface diffusion is used to form doped regions.

Embodiments of the invention provide compound semiconductor devices with ultrashallow junctions (USJs). The USJs refer to junctions 5 nm or less. The controllable nanoscale doping approach of embodiments of the invention utilizes molecular monolayers formed on a surface of a compound semiconductor. High areal dose control and high uniformity is possible through using the self-limiting nature of the monolayer formation reaction. Dopant atoms can be controllably positioned on a surface of a substrate by the reaction of the particular compound semiconductor (and orientation) with the particular dopant atom. Once the dopants are fouled on the surface of the substrate, a thermal annealing step is carried out to drive the atoms to a desired junction depth.

Figure 1A:
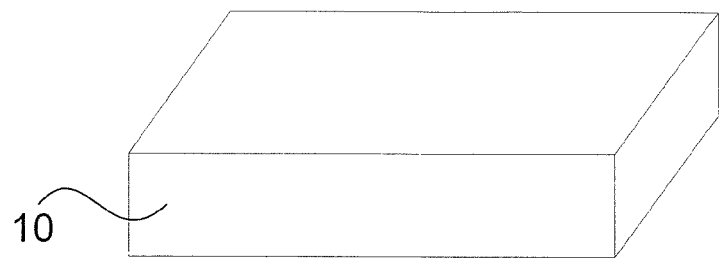
FIGS. 1A-1D illustrate a method of doping a compound semiconductor substrate according to an embodiment of the invention.
Figure 1B:
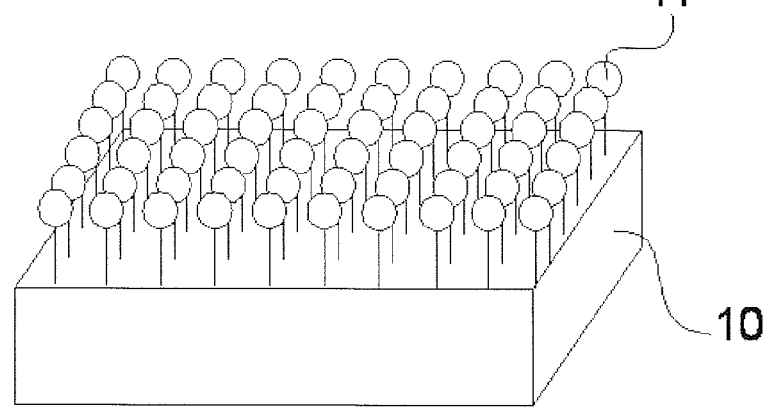

FIGS. 1A-1D illustrate a method of doping a compound semiconductor substrate according to an embodiment of the invention. Referring to FIG. 1A, a compound semiconductor substrate 10 can be provided. In one embodiment, the compound semiconductor substrate 10 can be an epitaxial layer prepared through an epitaxial growth process on a base substrate (not shown). The compound semiconductor substrate can have any crystal orientation. In one embodiment, InAs having (001) crystal orientation is used. Referring to FIG. 1B, a monolayer of dopant atoms 11 can be formed on the surface of the compound semiconductor substrate 10. For an InAs compound semiconductor substrate, n-type dopant of sulfur can be formed in a monolayer on the surface of the InAs substrate by treating the InAs substrate with ammonium sulfide. According to a specific embodiment, the InAs substrate is cleaned and then placed in an ammonium sulfide solution (($NH_4)_2S_x$) with excess sulfur, resulting in a formation of a sulfur monolayer on the surface of the InAs substrate. In another embodiment, the sulfur can be formed in a monolayer on the surface of the InAs substrate through a gas phase process performed at a low temperature (a temperature lower than the temperature needed to diffuse the dopant into the InAs substrate). According to a specific embodiment, the InAs substrate can be placed in a chamber for atomic layer deposition (ALD) and gas-phase sulfur can be formed on the surface of the InAs substrate.

Although n-type doping with sulfur is described herein, embodiments are not limited thereto. The dopant chemistry can be selected to achieve the appropriate reactions with the compound semiconductor substrate to provide p-type doping of the substrate. Embodiments of the invention utilize surface doping of the compound semiconductor substrates by attaching dopants to the surface of the substrate and then diffusing the dopants, thereby avoiding the destruction to the compound semiconductor lattice caused by ion implantation.

Figure 1C:
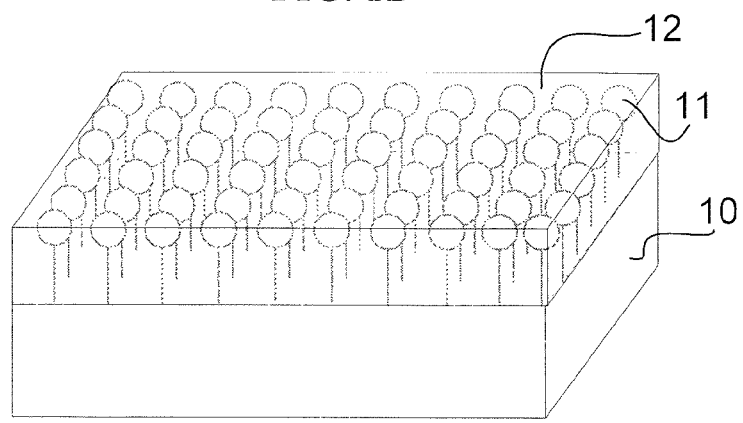

Then, referring to FIG. 1C, a capping layer 12 is formed on the substrate 10 having the monolayer of dopant atoms 11. The capping layer 12 can be formed, by example, by depositing silicon oxide or aluminum oxide on the substrate through electron beam evaporation. The capping layer inhibits the dopants on the surface of the substrate 10 from entering the ambient. In addition, the capping layer inhibits the group V element of the III-V compound semiconductor substrate from being desorbed from the substrate during the subsequent thermal annealing step.

Figure 1D:
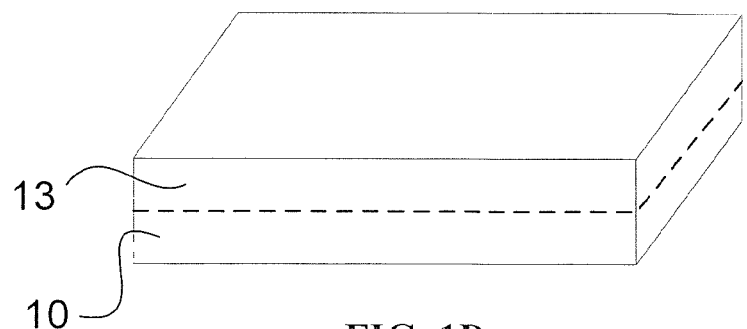

Referring to FIG. 1D, the dopant atoms can be driven into the substrate by performing a thermal annealing process, thereby forming a doped region 13 in the substrate 10. The temperature and time of the annealing process can be optimized according to the material system of the substrate in order to drive the dopant atoms into the substrate to a desired junction depth. For example, the annealing process can performed at a temperature greater than 300° C. for InAs substrates. In a specific embodiment, a temperature of about 400° C. can be used for driving dopants into an InAs substrate. In addition, the annealing process can be performed at a temperature greater than 500° C. for InGaAs substrates. As a specific example, temperatures in the range of 500° C. to 650° C. can be used for the InGaAs substrate. The capping layer 12 can be removed after the annealing process.

Figure 2A:
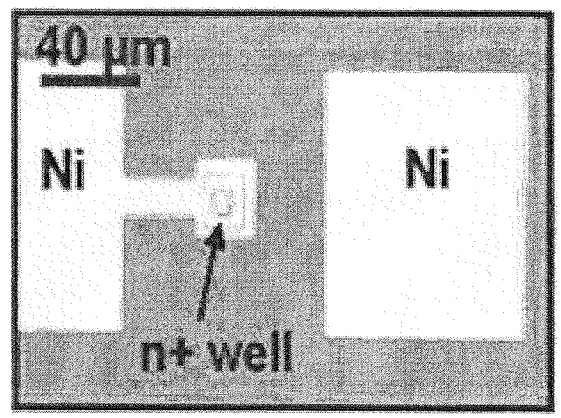
FIGS. 2A and 2B show a plan view optical image and a cross-sectional view schematic, respectively, of a representative diode formed by a sulfur monolayer doping (S-MLD) of a $p^+$ InAs substrate.
Figure 2B:
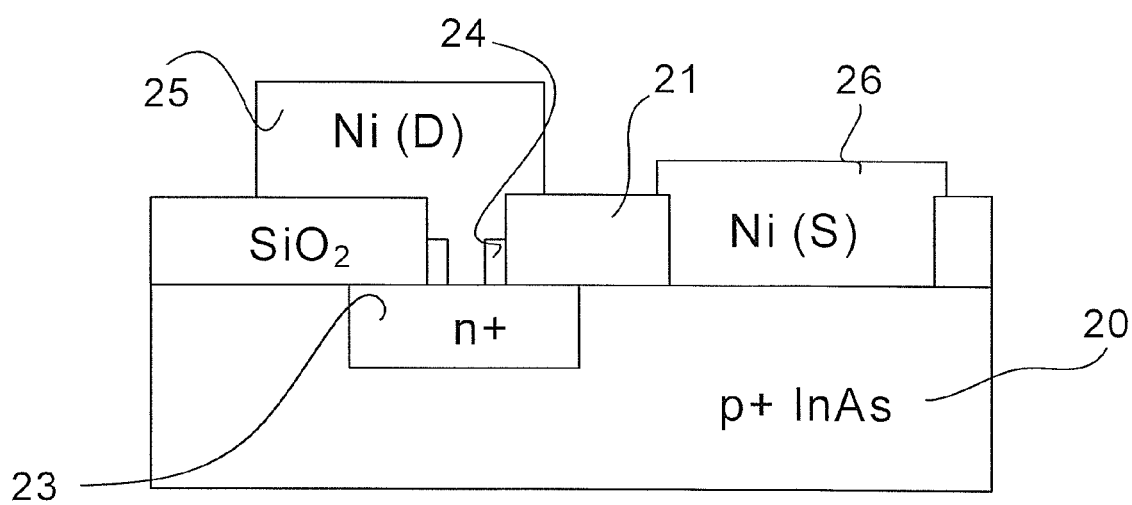

FIGS. 2A and 2B show a plan view optical image and a cross-sectional view schematic, respectively, of a representative diode formed by a sulfur monolayer doping (S-MLD) of a p' InAs substrate. As shown in FIGS. 2A and 2B, defined regions of a compound semiconductor substrate, such as a p+ InAs substrate 20, can be doped through the S-MLD process of the invention. For example, before the monolayer formation process described with respect to FIG. 1B, a mask pattern can be formed to expose only the regions upon which the monolayer of dopant atoms are to be formed. In one embodiment, the mask pattern is formed by depositing an oxide on the substrate and performing photolithography and etching processes to expose well regions (for the monolayer of dopant atoms to be diffused into). Then, the sulfur-containing monolayer can be assembled on the exposed well regions followed by a deposition of an oxide cap (see e.g., FIGS. 1B and 1C). The dopants can be driven into the substrate during an annealing process (see e.g., impurity region 23 of FIG. 2B). Portions of the oxide cap 24 and the oxide 26 of the mask pattern can be removed by photolithography and etching steps to expose contact regions (vias), and contacts 25 and 26 can be formed in the via holes (see FIG. 2B).

According to certain embodiments, in order to provide the $p^+$ InAs substrate, an InAs substrate can be made p-type during the growth process of the InAs substrate by using Zn. Alternatively, the substrate can be an InAs substrate having regions doped p-type by gas-phase surface diffusion of Zn as described with respect to another embodiment of the invention.

According to embodiments of the invention, shallow and ultrashallow (e.g., 5 nm or less) junctions can be formed in compound semiconductor materials through formation of self-assembled monolayers of dopant atoms (an areal dopant dose) on the surface of the compound semiconductor material and subsequent annealing to thermally diffuse the dopant atoms to a desired junction depth. For InAs compound semiconductor substrates, n-type junctions can be fabricated using sulfur atoms. While S-MLD is applicable for patterned n-type doping of semiconductor structures, patterned p-type doping can be accomplished through gas-phase surface diffusion or a monolayer deposition process using p-type dopants instead of the sulfur dopant of the S-MLD process.

According to certain embodiments of the invention, post-growth, patterned doping can be performed for compound semiconductor materials through gas-phase surface diffusion of dopants. The compound semiconductor materials can be bulk layers or nanowire (NW) structures. For patterned doping of compound semiconductor NWs, a mask (such as an oxide mask) can be formed to partially cover the compound semiconductor NWs, and gas phase doping can be performed to dope the exposed portions of the NWs.

Figure 3A:
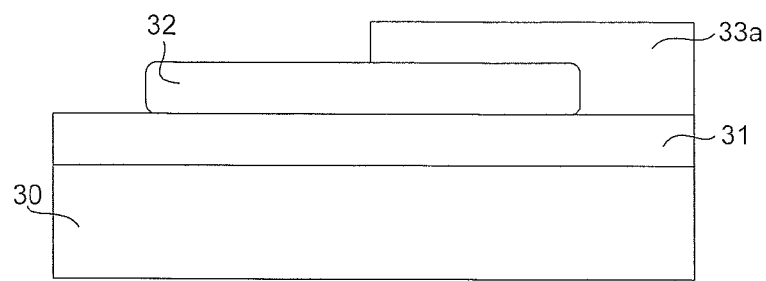
FIGS. 3A-3D illustrate a method of fabricating a back-gated NW diode according to an embodiment of the invention.

FIGS. 3A-3D illustrate a method of fabricating a back-gated NW diode according to an embodiment of the invention. Referring to FIG. 3A, compound semiconductor NWs 32 can be formed on a substrate. The substrate can include a conductive material for the back gate and a dielectric layer. According to one embodiment, the substrate can include a nitride layer 31 (such as $Si_3N_4$) on p+ silicon 30. In one embodiment, the compound semiconductor can include InAs. The InAs nanowire can be grown with n-type dopants or the intrinsic n-type properties of InAs can be utilized.

A mask layer 33a can be formed on the substrate including the NW to expose portions of the NW to be doped p-type. The mask layer 33a can be an oxide layer.

Figure 3B:
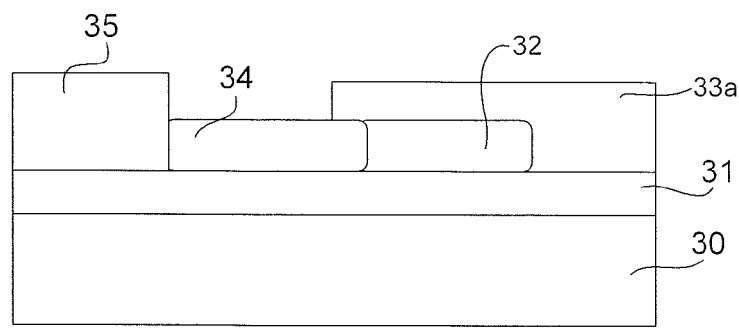

Referring to FIG. 3B, Zn gas phase doping can be performed for the exposed NW using the oxide mask layer as a diffusion mask during the doping process. The Zn gas phase doping can be carried out in a tube furnace using solid Zn powder as the source.

A contact can be foamed to the Zn-doped segment of the NW. The p-contact 35 can be formed covering (and contacting) at least a portion of the Zn-doped segment 34 of the NW 32.

Figure 3C:
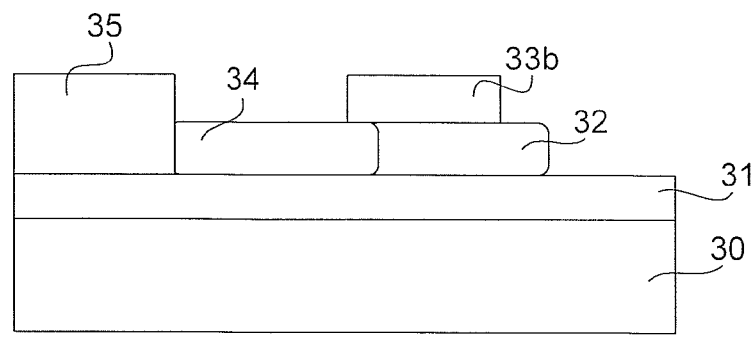
Figure 3D:
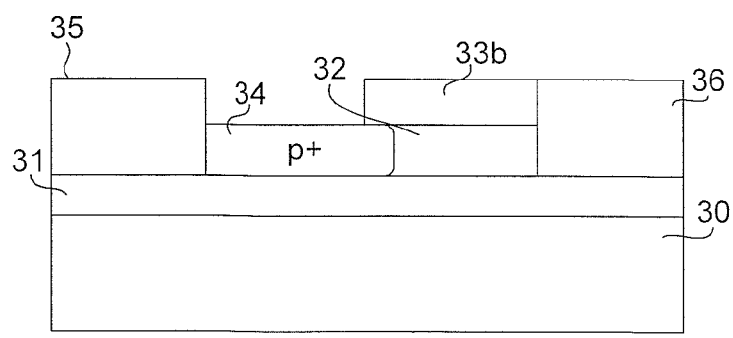

Referring to FIG. 3C, the mask layer 33a can be further etched, forming pattern 33b, to expose a portion of the as-grown compound semiconductor NW 32. Referring to FIG. 3D, a contact can be formed to the as-grown NW segment exposed by the pattern 33b. This contact can be referred to as an n-contact 36. Although not shown, resist from a photolithography process used to form pattern 33b may remain on the substrate during formation of the n-contact 36.

Figure 4A:
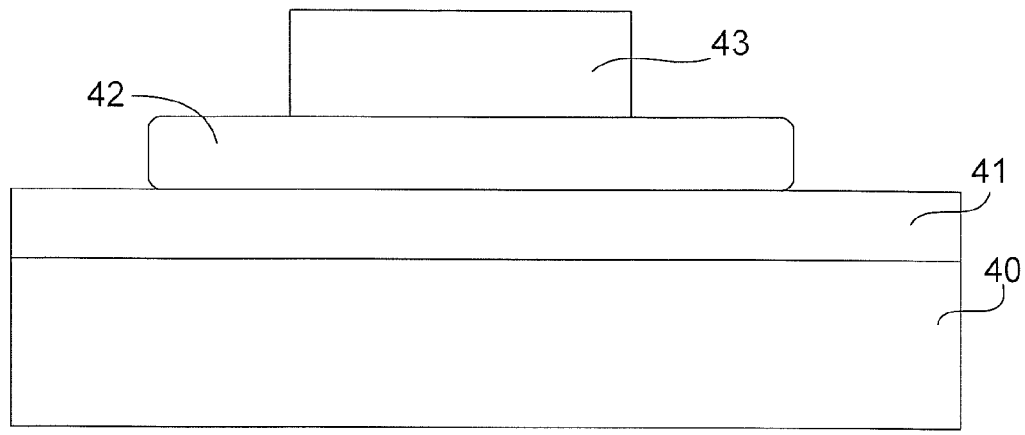
FIGS. 4A and 4B illustrate a method of fabricating a back-gated NW p-MOSFET according to an embodiment of the invention.
Figure 4B:
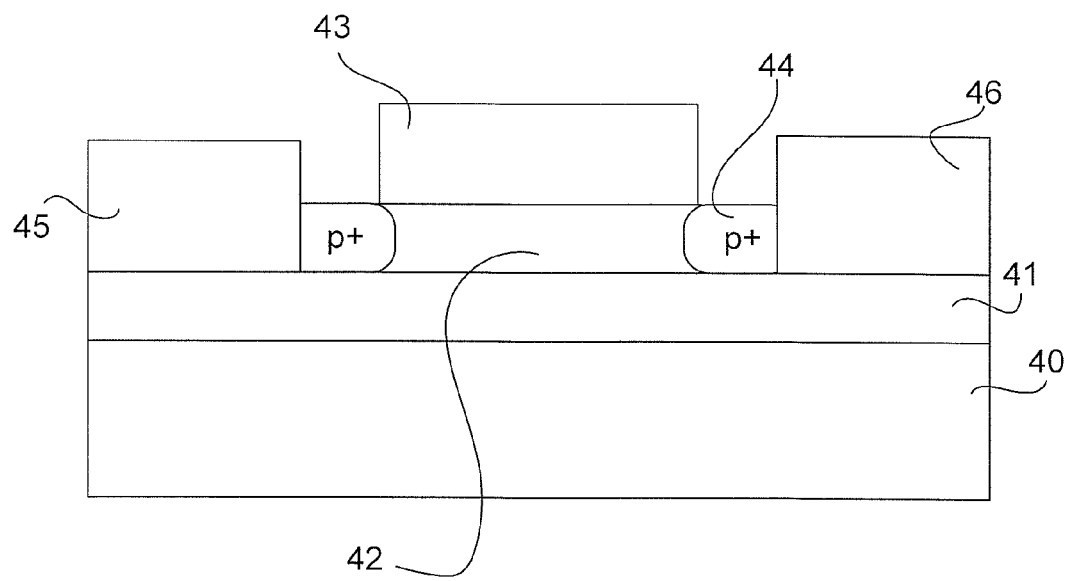

FIGS. 4A and 4B illustrate a method of fabricating a back-gated NW p-MOSFET according to an embodiment of the invention. Similar to the method steps described with respect to FIG. 3A, a compound semiconductor NW 42 can be formed on a substrate. The substrate can include a conductive material for the back gate and a dielectric layer. According to one embodiment, the substrate can include an oxide layer 41 (such as $SiO_2$) on p+ silicon 30. In one embodiment, the compound semiconductor can include InAs. The InAs nanowire can be grown with n-type dopants or remain as an intrinsic material. The n-type dopant concentration can be optimized for achieving desired channel characteristics.

A mask layer 43 can be formed on the substrate including the NW to expose portions of the NW to be doped p-type. The mask layer 43 can be an oxide layer.

Referring to FIG. 4B, Zn gas phase doping can be performed for the exposed NW using the oxide mask layer 43 as a diffusion mask during the doping process. The Zn gas phase doping can be carried out in a tube furnace using solid Zn powder as the source. Then, source and drain contacts 45 and 46 can be formed to the Zn-doped segments of the NW.

According to embodiments of the invention, dopant regions and junctions can be formed in compound semiconductor materials through exposure to gas-phase dopant atoms while under a heating condition to allow surface diffusion of the gas-phase dopant atoms into the compound semiconductor materials. For InAs compound semiconductor substrates and nanostructures, p-type junctions can be fabricated using gas-phase surface diffusion of Zn. For other compound semiconductor materials, p-type and/or n-type junctions can be fabricated using gas-phase surface diffusion of the appropriate p-type or n-type dopant.

According to certain embodiments of the invention, planar and nonplanar devices based on InAs and other III-V nanostructures can be fabricated using surface and gas-phase doping processes. Advantageously, embodiments of the subject surface and gas-phase doping processes are applicable to III-V-based structures that are not compatible with conventional ion implantation processes.

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

EXAMPLE 1

S-MLD to Form N-Doped InAs

To dope InAs substrates, InAs (001) substrates can be placed in an ammonium sulfide ($(NH_4)_2S_X$) solution with excess sulfur. For the experiments, the $(NH_4)_2S$, solution is 20% in water, Sigma Aldrich, and the excess sulfur is 0.2 g S per 15 ml of solution. The $(NH_4)_2S$, solution is maintained in a water bath at 35° C. The InAs (001) substrates can be initially cleaned with acetone and isopropanol in preparation of the S-MLD process.

To allow S monolayer formation on the substrate surface, the reaction is performed for 15 min. The InAs substrates are then rinsed in de-ionized water and immediately capped with an oxide. The capping oxide can be electronbeam evaporated silicon oxide ($SiO_2$). Subsequently, thermal annealing is performed to drive in the S atoms to the desired junction depth. For the experiments, the thermal annealing was performed from 350° C. to 450° C. for 300 s.

Figure 5:
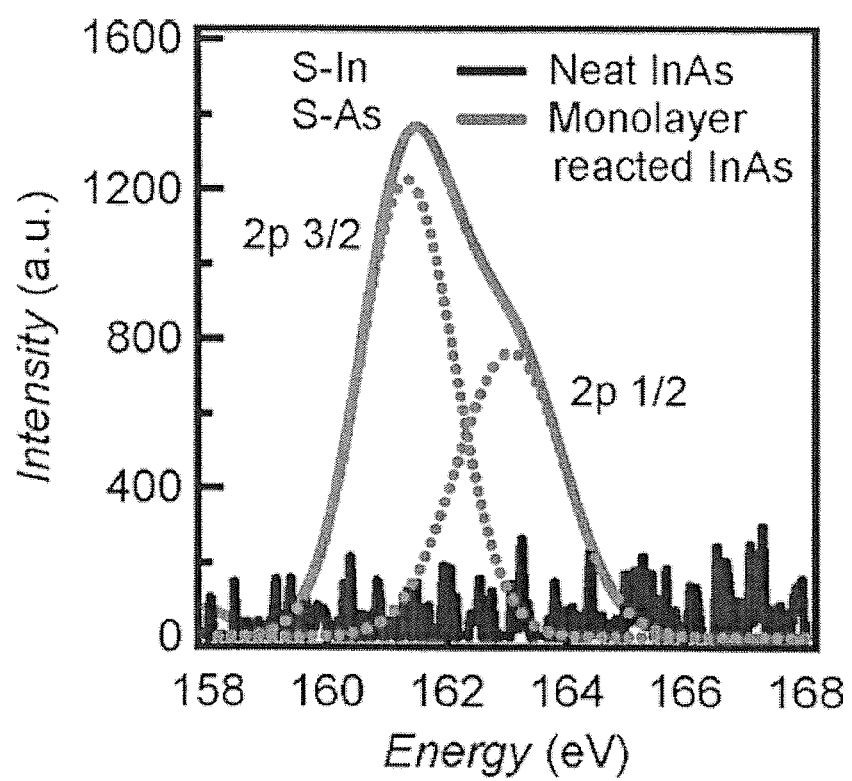
FIG. 5 shows a plot of surface characterization through x-ray photoelectron spectroscopy (XPS) of ammonium sulfide-treated InAs (001). The energy range corresponds to the S 2p binding energy.

FIG. 5 provides a characterization of the S monolayer formation. The ammonium sulfide treated surfaces were characterized by x-ray photoelectron spectroscopy (XPS) in an ultrahigh vacuum ($\sim 10^{-9}$ torr) at room temperature with a monochromated aluminum (Al) Kα source and pass energy set to 35.75 eV. FIG. 5 shows the S 2p peak spectra for a monolayer-reacted InAs (001) substrate compared against the signal from a neat (no sulfide treatment) substrate, with the S $2p_{3/2}$ and S $2p_{1/2}$ doublet peak fits. As shown in FIG. 5, for the monolayer-reacted sample, the S $2p_{3/2}$ peak occurs at 161.6 eV as expected. Because the In—S peak intensity is much stronger than the As—S peak intensity and the binding energies of S to metals lie within the 160-162 eV range, it can be concluded that the S 2p peak spectra primarily represents S—In bonding with only minimal S—As bonding present. This is indicative of an InAs surface terminated by an In plane with which the S monolayer is reacted, or the so-called "layer-cake" S-on-In-on-As model. The atomic surface density of InAs (001) is $5.6 \times 10^{14}$ cm$^{-2}$, which represents the maximum areal sulfur dose, assuming a perfect monolayer.

Figures 6A, 6B:
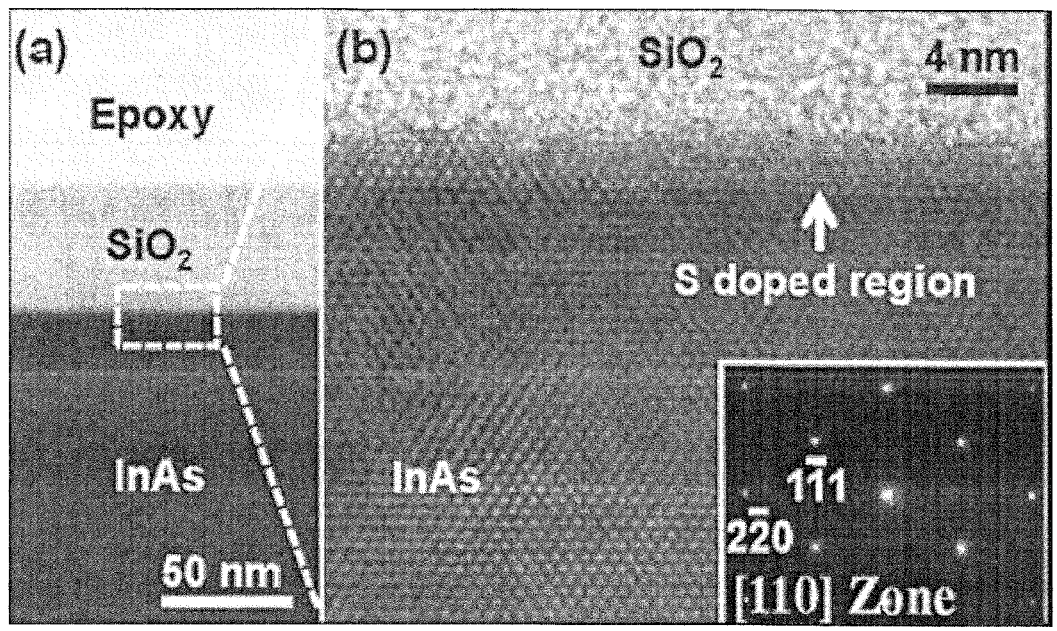
FIGS. 6A-6D show structural and chemical profiling of S-doped InAs fabricated according to an embodiment of the invention using an annealing condition of 450° C. for 300 s.

FIGS. 6A-6D provide a characterization of the junction formation after performing the S-MLD process. After thermal annealing to drive in the dopants, the InAs/$SiO_2$ and junction interfaces were investigated by transmission electron microscopy (TEM). FIGS. 6A and 6B show low and high resolution TEM images, respectively, showing $SiO_2$/S-doped InAs interfaces. The ~4 nm dark contrast region in FIGS. 6A and 6B corresponds to the S-doped layer. In addition, as shown in FIG. 6B, the high resolution TEM image for a sample annealed at 450° C. for 300 s depicts the single crystalline nature of the S doped region and the abrupt $SiO_2$/InAs interface. This is in distinct contrast to the number of defects induced in conventional ion-implantation techniques.

Figure 6C:
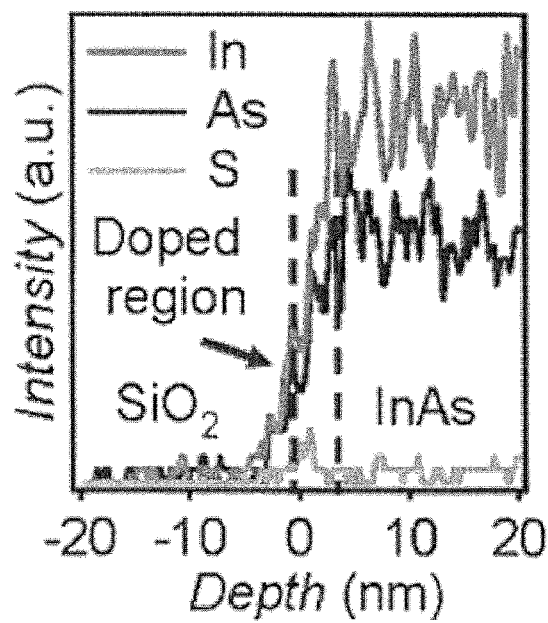
Figure 6D:
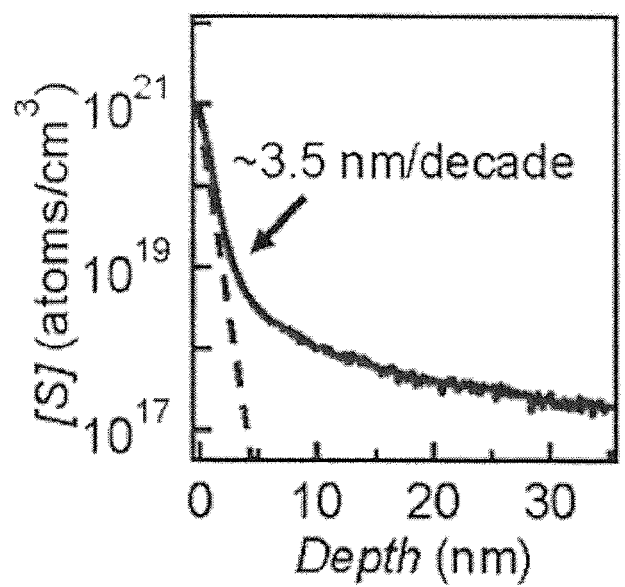

In order to characterize the chemical profile of the junction, energy dispersion spectroscopy (EDS) line profiling was performed across the $SiO_2$/InAs interface by using scanning TEM mode with a probe size of 0.2 nm, as shown in FIG. 6C. Referring to FIG. 6C, a clear S peak is at the onset of the In and As signals, indicating the chemical presence of S in the monolayer doped junction. A ~3.08 atom % of S is found at ~1 nm from the InAs/$SiO_2$ interface based on the EDS analysis. The abrupt S profile (~3.5 nm/decade) is further quantitatively confirmed with the secondary ion mass spectrometry (SIMS) profile shown in FIG. 6D. A high S concentration of $\sim 1 \times 10^{21}$ cm$^{-3}$, in agreement with the EDS result, is measured at the InAs surface. Therefore, a shallow S profile is accomplished through the subject MLD technique. Accordingly, MLD technique of embodiments of the subject invention can be used to form USJs in compound semiconductors.

EXAMPLE 2 n$^+$/p$^+$ Tunnel Diodes Through S-MLD of Heavily Zn-Doped InAs Substrates

The MLD technique of embodiments of the subject invention can be applied to form devices having doped regions. To examine the electrical properties of the S monolayer doped junctions of embodiments of the invention, n$^+$/p$^+$ tunnel diodes were fabricated on heavily Zn-doped InAs substrates ($N_B \sim 6 \times 10^{18}$ cm$^{-3}$).

FIGS. 2A and 2B show a plan view optical image and a cross-sectional view schematic, respectively, of a representative diode formed by a sulfur monolayer doping (S-MLD) of a p$^+$ InAs substrate.

For the experiment example, referring to FIGS. 2A and 2B, 125 nm of field oxide 21 was deposited on the heavily Zn-doped InAs substrate 20 by electron-beam evaporation. Photolithography and wet etching using 50:1 hydrofluoric acid was used to define the well regions 23. The sulfur-containing monolayer was then assembled on the exposed InAs well regions following the technique described in Example 1, and a 35 nm thick $SiO_2$ cap 24 was subsequently deposited. The sample was annealed in a rapid thermal annealing tool at 400° C. for 300 s. To test the device, n+ and p+contacts were formed by defining vias through photolithography and hydrofluoric acid etching of the oxide (field oxide 21 and cap 24) and then forming a ~150 nm thick Ni contacts 25 and 26 on top of the sulfur doped regions 23 and p+ contact area, respectively. The junction area for the experimental device is ~314 μm$^2$.

Figure 7:
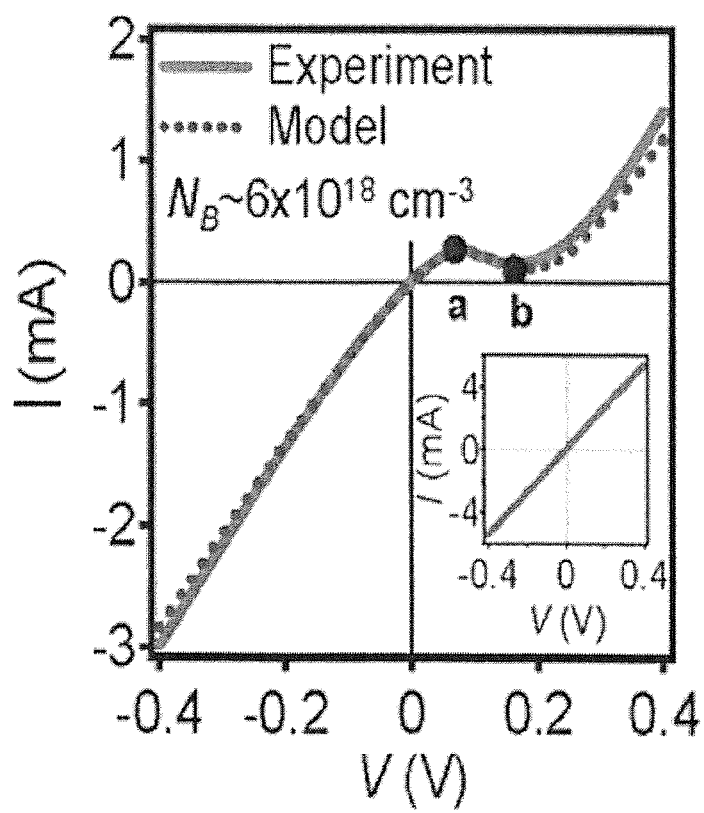
FIG. 7 shows a plot of I-V characteristics of a diode fabricated according to an embodiment of the invention and a simulated model assuming a sulfur doping concentration of $N_D=8\times10^{18}$ cm$^{-3}$, indicating negative differential resistance (NDR) behavior. The inset shows electrical properties for a control device fabricated without the application of S monolayer.

As illustrated in FIG. 7, the tunnel diode fabricated in accordance with an embodiment of the invention shows negative differential resistance (NDR) behavior. A control device was fabricated using the same procedure as the experimental device, but without the application of S monolayer Referring to the I-V characteristics shown in FIG. 7, For the reverse bias (<0 V), the observed current is due to the band-to-band tunneling as the electrons tunnel from the valence band on the p-side of the junction into the conduction band on the n-side of the junction and the current increases with the bias indefinitely. For forward bias (>0 V), the electrons tunnel from filled states in the conduction band (n$^+$ side) to unoccupied states in the valence band (p$^+$ side) to result in a peak current at point "a". Here the peak voltage $V_p$=0.08 V and the peak current $I_p$=0.26 mA. As the forward bias continues to increase, the band overlap diminishes, resulting in the observed NDR.

When the n-side conduction band edge rises above the p-side valence band edge, there are no more states for tunneling resulting in the valley current at point "b". Here, the minimum (valley) voltage $V_m$=0.16 V and the minimum (valley) current $I_M$=0.15 mA. This gives a peak-to-valley ratio $I_p/I_m$=1.7, which is a slight improvement over the peak-to-valley ratio of 1.61 reported in the literature obtained by other doping processes for InAs diodes exhibiting NDR behavior. From this onset, normal diffusion current starts to dominate in the forward current. The gamma factor $\gamma=(d^2I/dV^2)/(dI/dV)$ for the diode shown in FIG. 7 is $\gamma$~6.8, which is also an improvement over the $\gamma$~4.5 found in the literature. This NDR observation is direct evidence of band-to-band tunneling which requires degenerate doping in both n- and p-regions with small tunneling barrier width (i.e., abrupt junctions).

Based on Kane's model of tunneling where the electric field is assumed to be constant, the electrically active S concentration is estimated to be $N_D$~8×10$^{18}$ cm$^{-3}$, which is close to the highest activated concentration found in the literature. Using this doping concentration, where n=$N_D$–$N_B$ since the S doping compensates the Zn dopants in the substrate, a modeled I-V curve is provided in FIG. 7. For the tunnel diode, $N_B$=6×10$^{18}$ cm$^{-3}$ and n=2×10$^{18}$ cm$^{-3}$. A series resistance of 100Ω was included in the modeling, which accounts for the parasitic resistance due to the substrate and/or contacts. The modeled tunneling current matches the experimental data fairly closely. The discrepancy between the modeled and SIMS concentration (see also FIG. 6D) values indicates that only a fraction of the S atoms is electrically active, with the remaining S atoms likely still passivating the surface or occupying non-electrically active sites in the bulk.

As can be seen from the NDR behavior illustrated in FIG. 7, the subject MLD technique is capable of providing heavy doping with sharp junction abruptness.

To verify that the NDR behavior of the fabricated diodes is due to the S-doping rather than a surface electron inversion layer, control experiments were performed. The I-V characteristics of the control devices are shown in the inset of FIG. 7. The control devices were fabricated using the exact same fabrication procedure described above and the same p$^+$ InAs substrate, but without the S monolayer treatment. As a result, the fabricated devices consist of two Ni source/drain contacts formed directly on the p$^+$ InAs substrate. As shown in the inset of FIG. 7, the control devices exhibit a near-linear behavior attributed to the near Ohmic contact formation to p$^+$ InAs. This is in contrast to the lightly p-doped InAs substrates that are known to be hard to form Ohmic contacts due to the surface inversion layers. However, for the heavily doped p' InAs substrates with $N_B$~6×10$^{18}$ cm$^{-3}$ used in this work, near Ohmic contacts are readily formed by Ni. Although not shown in FIG. 7, another control device was fabricated, involving S monolayer formation on the surface of the p' InAs substrate, without the thermal annealing step to drive in the dopants, followed by Ni contact formation. The results of the tests showed linear V characteristics for these second control devices, suggesting the lack of diode formation.

EXAMPLE 3

InAs NW Fabrication

InAs NWs used for experiment example embodiments were grown using the vapor-liquid-solid (VLS) method by chemical vapor deposition in a two-zone tube furnace using solid InAs powder source. A 0.5 nm thick Ni film was annealed at 800° C. for 10 min to create nanoparticles that serve as catalysts. A substrate temperature of 490° C., source temperature of 720° C., pressure of 5 torr with H$_2$ carrier gas (200 SCCM flow rate) were used. The grown NWs were harvested by sonication in anhydrous ethanol and dropcasted on Si substrates.

EXAMPLE 4

Gas Phase Surface Diffusion of Zn to Form p-Doped InAs NWs

To achieve patterned doping, a SiO$_2$ mask was deposited on the InAs NWs fabricated as described in Example 3 to partially cover the NWs on substrates.

To p-dope the NWs with Zn atoms, the samples were placed in a tube furnace with solid Zn powder used as the source. The NW substrate and Zn source were placed ~6 cm apart with the furnace temperature set at 400-415° C. for 1 min (as counted from temperature stabilization time). A chamber pressure of 650 torr with Ar atmosphere was used.

The diffusion length of Zn atoms can be approximated as 2 $\sqrt{Dt}$, where D is the diffusion coefficient and t is the diffusion time. A diffusion coefficient D~1.4×10$^{-12}$ cm$^2$/s at 400° C. for Zn in InAs bulk substrates is reported in the literature. Given this diffusion coefficient value, a diffusion length of ~180 nm is estimated for the t=1 min used in the experiments. Using this estimation, the process conditions result in the InAs NWs being fully doped across their diameter (i.e., d<diffusion length), while avoiding or minimizing Zn atom diffusion far along the length of the NW or underneath the SiO$_2$ mask once incorporated into the NW. This is an important requirement for the fabrication of p-n junctions. This diffusion length is relatively small given that the experiment devices are long channel devices with channel lengths L 6-10 μm.

Adjusting the annealing time can be used to reduce the diffusion length, as needed for short channel devices. It should be noted that the diffusion parameters used for this analysis are for the bulk substrates as there are no values currently reported for the NW system.

Figure 8A:
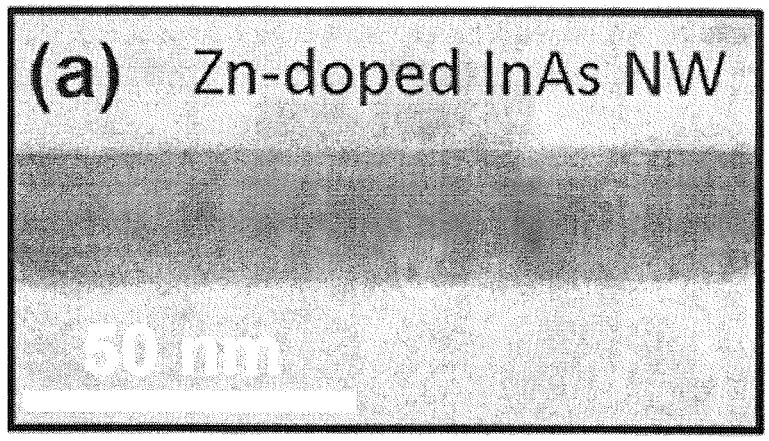
FIGS. 8A and 8B show a low-resolution and a high-resolution TEM image, respectively, of a Zn-doped InAs NW of an embodiment of the invention. The inset of FIG. 8B shows a diffraction pattern of the Zn-doped InAs NW.
Figure 8B:
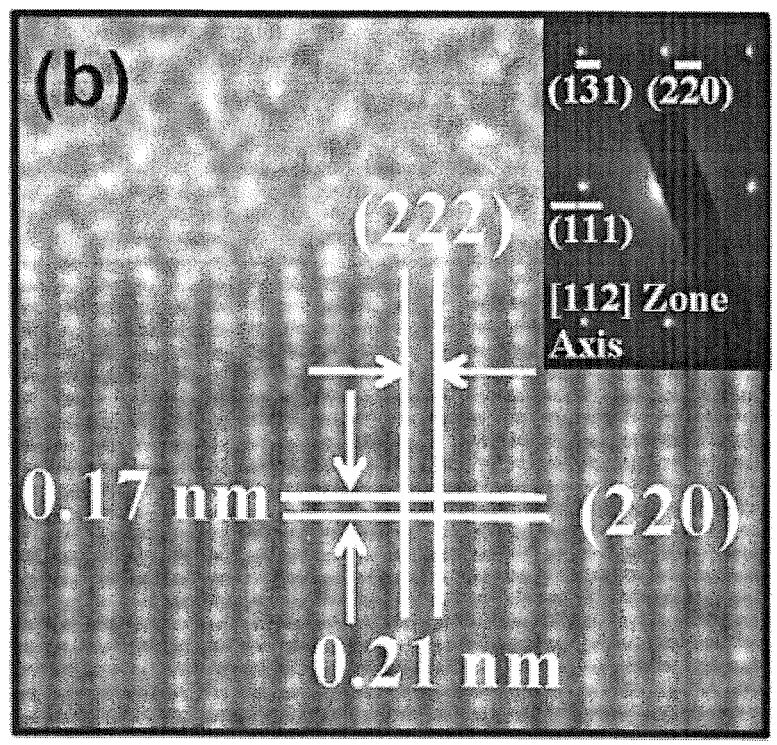

Low-resolution and high-resolution TEM images of a Zn-doped InAs NW are shown in FIGS. 8A and 8B. The high resolution TEM image of FIG. 8B shows the single-crystalline and defect-free nature of the doped InAs NW for which two planes, (222) and (220), are indexed. The diffraction pattern is shown in the inset of FIG. 8B with a [112] zone axis.

Figure 9:
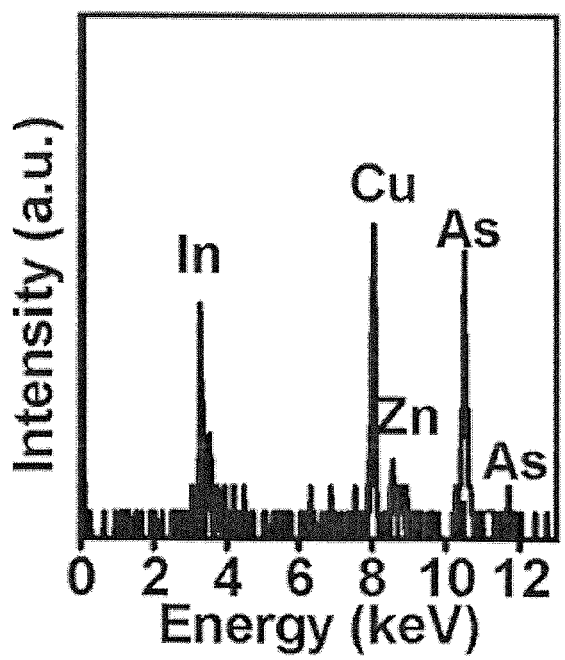
FIG. 9 shows a plot of EDS analysis of a Zn-doped InAs NW of an embodiment, depicting an elemental composition of ~5 atom % Zn.

FIG. 9 shows the energy dispersion spectroscopy (EDS) quantitative analysis of a Zn-doped InAs NW for which the elemental composition of ~5 atom % Zn can be identified. Given the atomic density of 1.8×10$^{22}$ cm$^{-3}$ for InAs, this corresponds to a Zn concentration of [Zn] ~9×10$^{20}$ cm$^{-3}$. It should be noted that this concentration is over an order of magnitude higher than the [Zn] 3×10$^{19}$ cm$^{-3}$ reported in the literature for bulk. InAs using a diffusion temperature of 500° C. This may be the result of a fraction of the Zn atoms remaining on the surface of the NWs or that the NW system exhibits a higher solid solubility limit as compared to the bulk.

EXAMPLE 5

Back-Gated InAs NW Device Through Gas Phase Surface Diffusion of Zn

To characterize the electrically active content of Zn dopant atoms, back-gated devices were fabricated using dropcasted NW substrates. For the experiments the NWs were fabricated as described in Example 3 with the substrates being p$^+$Si with a 50 nm SiO$_2$ layer thereon. The heavily doped Si substrate is used as the global back gate with a gate dielectric thickness of 50 nm $SiO_2$. Photolithography was used to define source (S) and drain (D) regions on the dropcasted NW substrates, and Ni was then thermally-evaporated into the S/D regions to form contacts.

Figure 10:
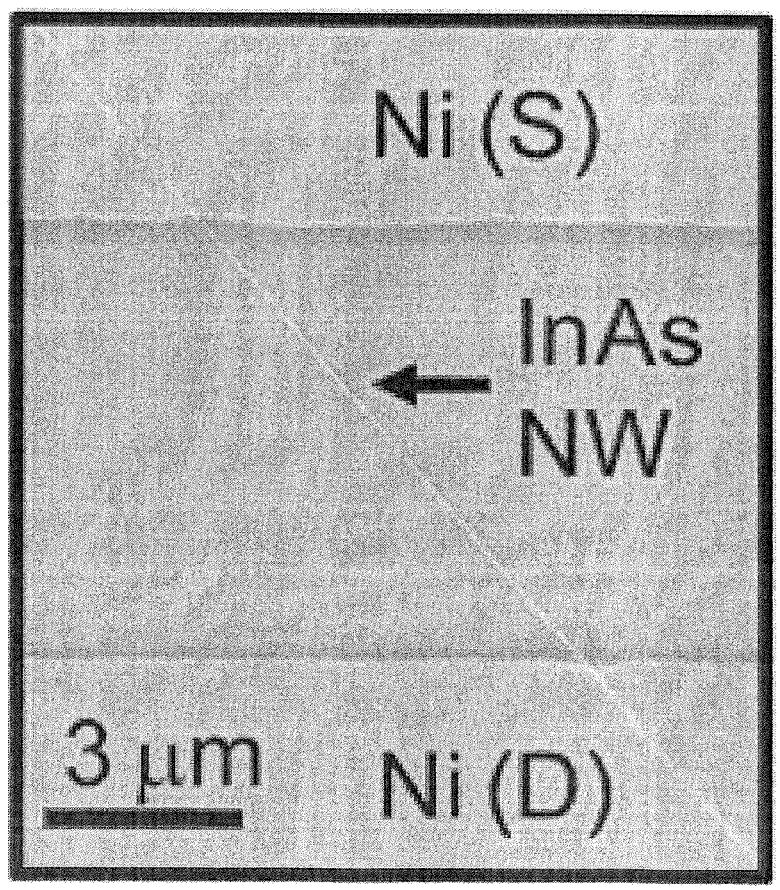
FIG. 10 shows a false-color SEM image of a representative as-grown InAs NW device fabricated in accordance with an embodiment of the invention.

FIG. 10 shows a representative scanning electron microscope (SEM) image of such a back-gated NW device. Long channel lengths. L=6-10 μm, are used to make sure that transport of carriers is in the diffusive, as opposed to ballistic or quasi-ballistic regime. This enables the extraction of intrinsic transport properties, such as carrier mobility.

Figure 11A:
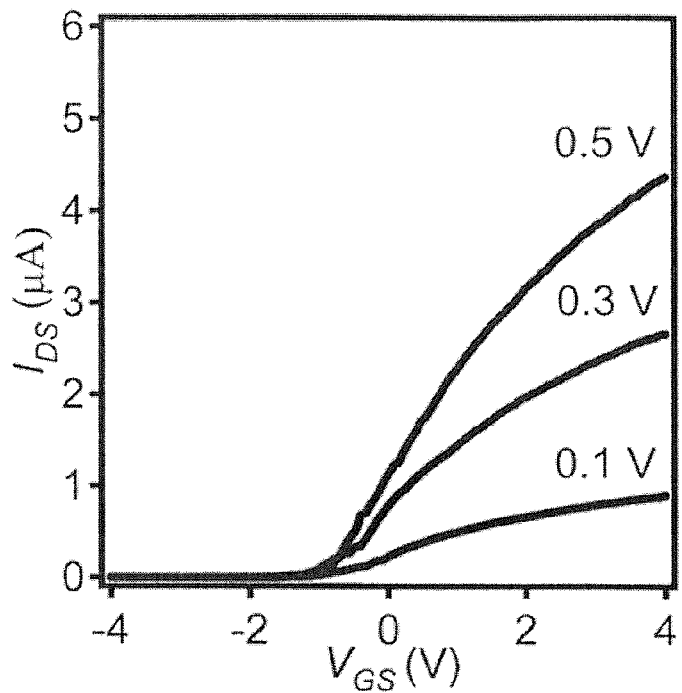
FIGS. 11A and 11B show the $I_{DS}$-$V_{GS}$ characteristics of a representative as-grown InAs NW representative device according to an embodiment of the invention (FIG. 11A) and a blank (i.e. un-patterned) Zn doped InAs NW (FIG. 11B). An $I_{DS}$-$U_{DS}$ plot for $V_{GS}$=0 for the blank Xn doped InAs NW is shown in the inset of FIG. 11B.
Figure 11B:
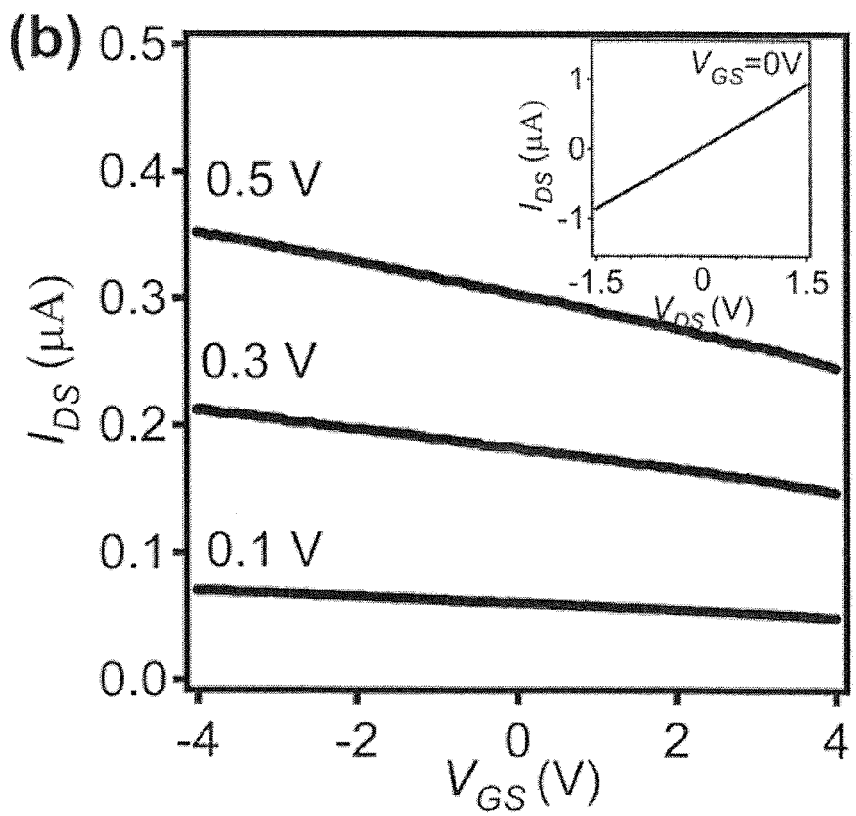

The I-V characteristics of a representative as-grown InAs NW and blank (i.e. unpatterned) Zn-doped InAs NW are shown in FIGS. 11A and 11B. For the blank Zn-doped InAs NW, before defining the S/D contacts, the samples were placed into a tube furnace under the doping conditions described in Example 4.

The as-grown InAs NW is n-type due to the high electron concentration that results from surface fixed charges and local imbalances in stoichiometry. Because there is a linear dependence of the device resistance on channel length, the Ni source/drain contacts to the conduction band of as-grown InAs NWs are ohmic. Referring to FIG. 11A, the as-grown NW exhibits an ON current of ~4.4 μA at $V_{DS}$=0.5V, $I_{ON}/I_{OFF}$>$10^4$, and field-effect mobility of 4400 $cm^2$/Vs for channel length L=8 μm and NW diameter d=27 nm, consistent with previously observed values. Referring to FIG. 11B, the InAs NWs doped in accordance with an embodiment of the invention are p+ due to heavy Zn doping, exhibiting an ON current of ~0.4 μA at $V_{DS}$=0.5V with minimal gate dependence. The linear behavior of the $I_{DS}$-$V_{DS}$ plot shown in the inset of FIG. 11B confirms that the contacts to the p+ NW are near ohmic. This is primarily due to the thinning of the Schottky barriers at the contacts to the valence band of NWs arising from the heavy Zn doping. From the $I_{DS}$-$V_{DS}$, characteristics, a hole field-effect mobility of ~30 $cm^2$/Vs for a NW diameter of d~30 nm is estimated. This field-effect mobility is reasonable given that the hole Hall mobility of bulk InAs substrates for a doping concentration of ~1×$10^{19}$ $cm^{-3}$ acceptors is ~100 $cm^2$/Vs at room temperature and that the measured Hall mobility is always larger than the extracted field-effect mobility. Using the conductance G 6×$10^{-7}$ S and d~30 nm, the resistivity ρ~0.02 Ω-cm is estimated for the doped NW. From p and u, the electrically-active [Zn] is estimated to be ~1×$10^{19}$ $cm^{-3}$. This high electrically-active [Zn] corresponds to degenerate doping, with the Fermi level EF located ~0.024 eV below the valence band edge $E_v$. This electrically active Zn concentration is consistent with those reported for various dopants in bulk InAs substrates. While most (~70%) NWs exhibited p+ behavior (minimal gate dependence) for doping temperatures of greater than 400° C. some (~30%) NWs exhibited lightly p-type or ambipolar behavior. For doping temperatures less than 400° C., roughly half of the NWs were ambipolar while the other half remained n-type. For the p+ NWs, there was sufficient Zn doping to fully compensate the high intrinsic electron concentration, especially at the surface. However, for the ambipolar NWs, it is likely that the core of the NW is doped p-type while the high surface electron concentration "shell" remains n-type. This observation is especially expected for lower diffusion temperatures, which effectively lowers the diffusion rate and the solid solubility limit of Zn.

For comparison, InAs NWs were also doped using Zn ion-implantation. Specifically, an ion implantation energy of ~35 keV with dopant areal dose of 3.5×$10^{12}$-3.5×$10^{13}$ $cm^{-2}$ were used, followed by thermal annealing at 375° C. for 30 min. For the InAs NWs doped using Zn ion implantation, the channel length was ~2 μm and the NW diameter was ~30 mil.

Figure 12A:
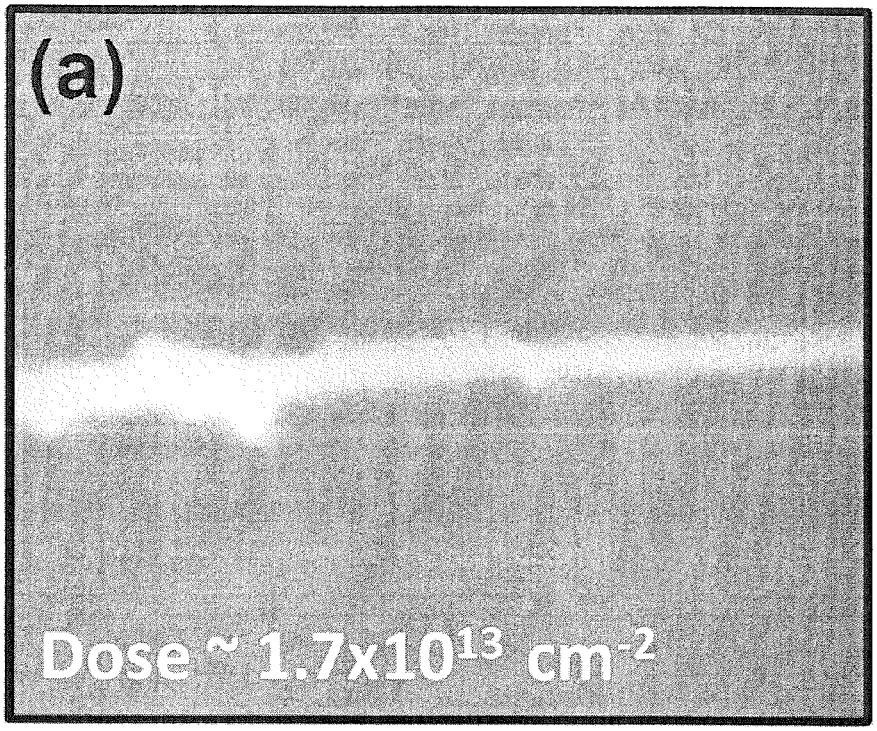
FIGS. 12A and 12B show scanning electron microscopy (SEM) images of InAs NWs doped by Zn ion-implantation for dopant areal dose of ~1.7×10$^{13}$ cm$^{-2}$ (FIG. 12A) and ~3.5×10$^{13}$ cm$^{-2}$ (FIG. 12B) and subsequently annealed at 375° C. for 30 min, indicating severe damage to the NWs when doping is performed by ion implantation.
Figure 12B:
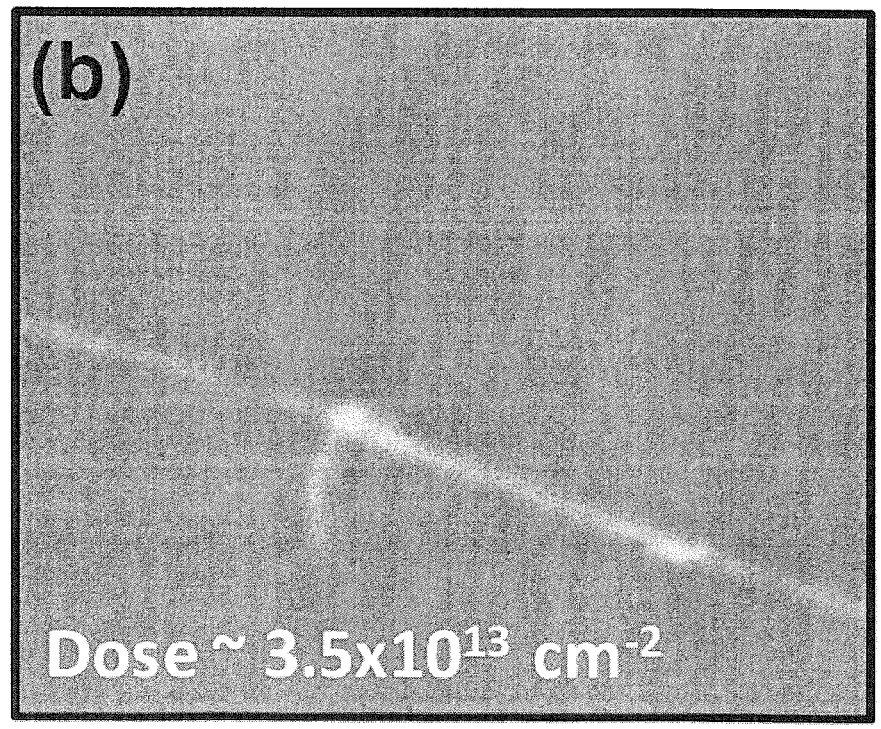
Figure 13A:
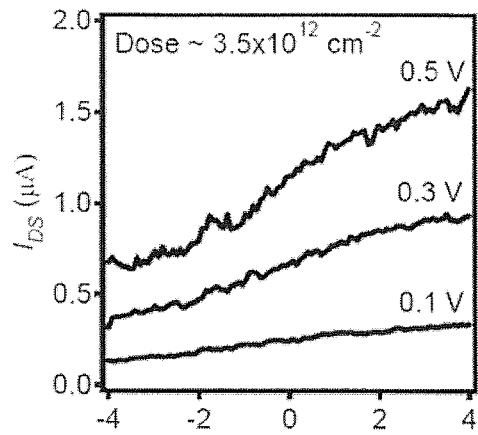
FIGS. 13A-13C show plots of $I_{DS}$-$V_{GS}$ characteristics of InAs NWs doped by Zn ion-implantation for dopant areal dose of ~3.5×10$^{12}$ cm$^{-2}$ (FIG. 13A), ~1.7×10$^{13}$ cm$^{-2}$ (FIG. 13B) and ~3.5×10$^{13}$ cm$^{-2}$ (FIG. 13C) and subsequently annealed at 375° C. for 30 min.
Figure 13B:
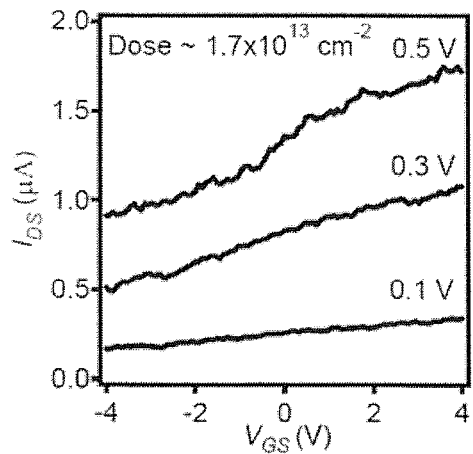
Figure 13C:
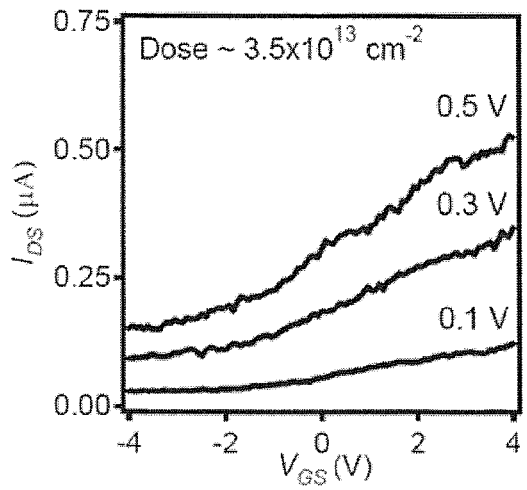

As shown in FIGS. 12A and 12B, scanning electron microscopy (SEM) clearly indicates that the NW surfaces are severely damaged by the ion implantation, and in some cases, the NWs were even broken with damage being the most apparent for the highest dopant dose of ~3.5×$10^{13}$ $cm^{-2}$. Furthermore, back-gated devices fabricated from the Zn ion-implanted InAs NWs remained n-type with degraded ON currents and did not turn off, even after thermal annealing (see FIGS. 13A-13C), suggesting that the incorporated dopants are not electrically active and that the damage to the NW lattice degraded the electrical properties and enhanced the leakage currents. The failure of the Zn ion implantation approach to produce defect-free p-type NWs highlights the importance of the Zn surface doping scheme of embodiments of the invention for use in fabricating compound semiconductor nanostructures.

EXAMPLE 6

Back-Gated InAs NW Diode

Various NW device structures involving dopant profiling were fabricated and tested. In one example, back-gated diodes were fabricated by patterned Zn doping of InAs NWs following the process illustrated in FIGS. 3A-3D. For these example devices, 60 nm of $Si_3N_4$ (see 31 of FIG. 3A) was grown by PECVD on Si substrates (see 30 of FIG. 3A). As-grown InAs NWs (see 32 of FIG. 3A) were then dropcasted on the nitride substrate as described in Example 3, and 70 nm electron-beam evaporated $SiO_2$ (see 33a of FIG. 3A) was deposited on photolithographically patterned regions to cover parts of the NWs, followed by lift-off of the resist. In this case, the evaporated $SiO_2$ (see 33a of FIG. 3A) served as the diffusion mask during the doping process.

The NW substrates were then Zn-doped by the gas-phase surface doping process as described in Example 4, with only the unmasked segments of the NWs exposed to Zn dopants. Ni contacts (see 35 of FIG. 3B) were then made to the Zn-doped segments (see 34 of FIG. 3B) of the NWs by photolithography and thermal evaporation. A final photolithography step, followed by etching in 50:1 HF to remove the $SiO_2$ mask (see FIG. 3C) and subsequent Ni thermal evaporation were applied to contact the undoped regions (i.e., as-grown, n-type) of the NWs (see FIG. 3D).

Figure 14:
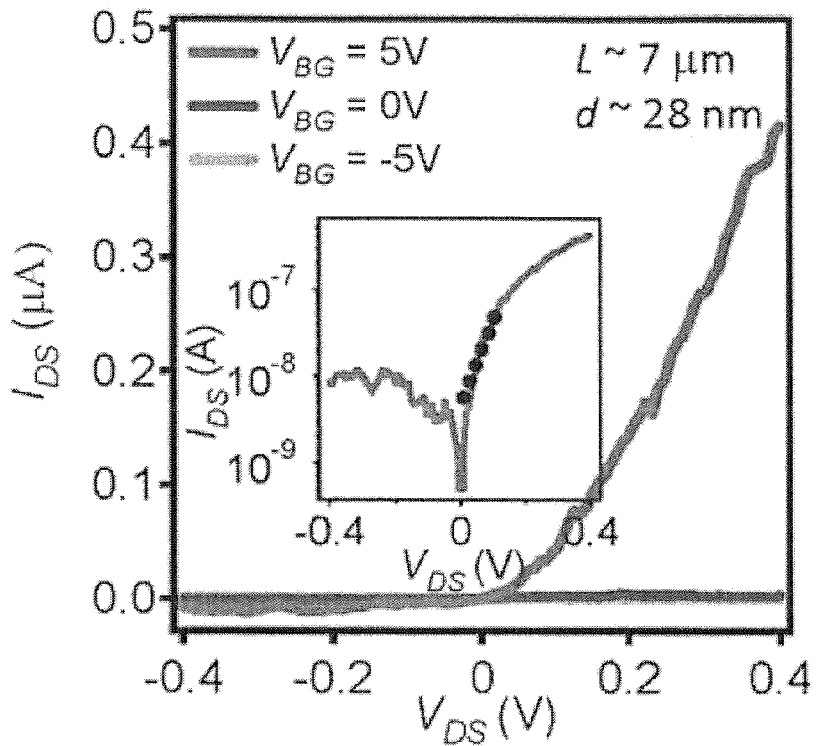
FIG. 14 shows the I-V behavior of a representative diode according to an embodiment of the invention as a function of the back-gate voltage, $V_{BG}$. The inset shows the logscale plot for $V_{BG}$=5V and the fit to the ideal diode equation indicated by the dotted line.

The I-V behavior of a representative diode with L~7 μm and d~28 nm is shown in FIG. 14. A rectifying behavior is observed for $V_{BG}$>0. On the other hand, the device is insulating for $V_{BG}$<0 (as indicated by the $I_{DS}$ behavior for $V_{BG}$=0 V and ~5 V). This behavior and the $I_{DS}$-$V_{GS}$ curves of FIG. 9 indicate that the Zn-doped region of the NW is p+ and is always in the hole accumulation mode, while the n-type region is being modulated by the back-gate. The n-type segment becomes fully depleted for $V_{BG}$≤0, but turns to the accumulation mode for $V_{BG}$>0 and $V_{DS}$>0. The ideality factor of the p+-n diode shown in FIG. 14 is ~1.5, with the fit to the ideal diode equation indicated by the dotted line in the logscale inset.

EXAMPLE 7

Bulk InAs Diode

Figure 15:
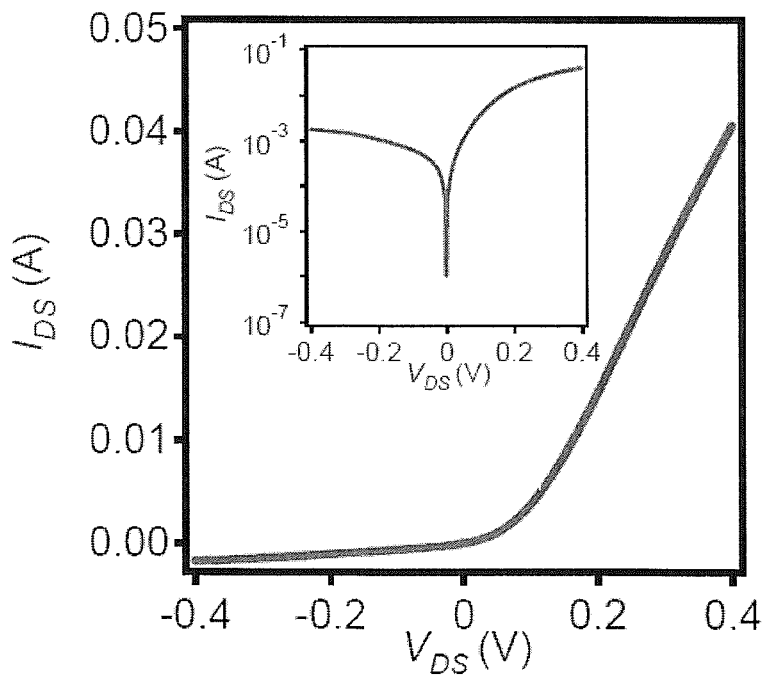
FIG. 15 shows I-V characteristics of a representative InAs diode fabricated on a bulk intrinsic substrate (electron concentration ~2×10$^{16}$ cm$^{-3}$) by the gas-phase Zn surface doping approach according to an embodiment of the invention.

FIG. 15 shows I-V characteristics of a representative InAs diode fabricated on a bulk intrinsic substrate (electron concentration ~2×$10^{16}$ $cm^{-3}$) by the gas-phase Zn surface doping approach according to an embodiment of the invention. The junction area of the device plotted in FIG. 15 is ~10,000 µm². Notably, the process is compatible with bulk InAs substrates. For example, bulk InAs substrates can be placed in a tube furnace with solid Zn powder used as the source. The furnace temperature can be set at a temperature such as 400-415° C. for a period of time such as 1 min (as counted from temperature stabilization time). The gas-phase diffusion can be carried out in a similar atmosphere and pressure as the conditions for doping the InAs NWs.

Therefore, compound semiconductor NW and bulk compound semiconductor diodes can be fabricated using gas-phase diffusion doping, each exhibiting similar properties.

EXAMPLE 8

Back-Gated InAs NW p-MOSFET

Figure 16A:
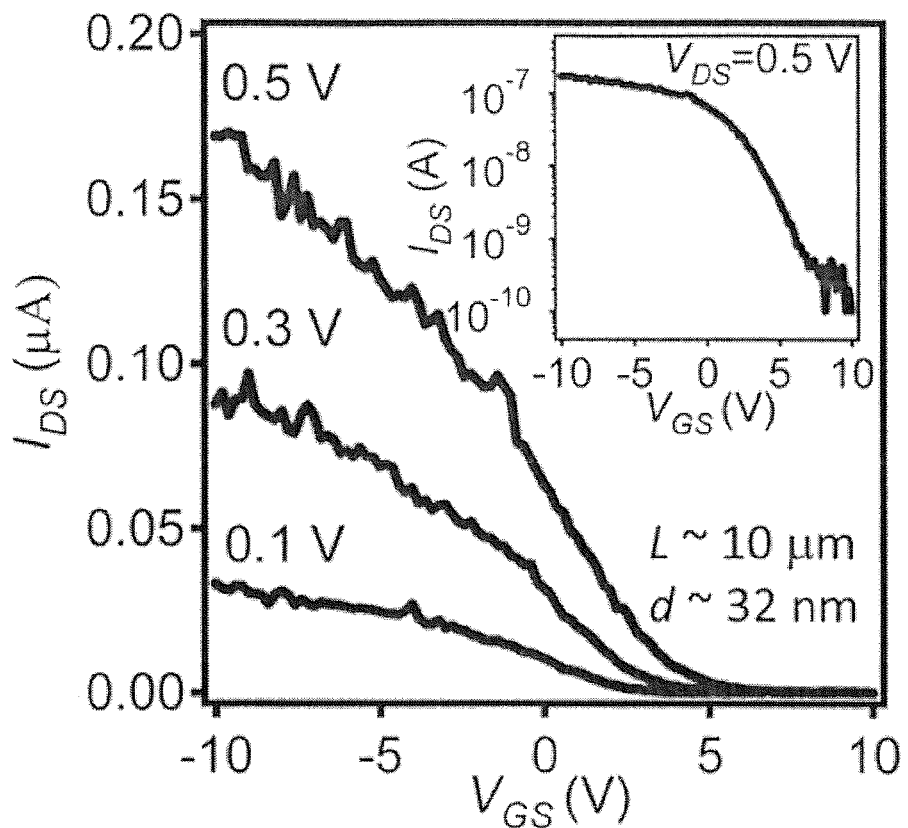
FIG. 16A shows a plot of $I_{DS}$-$V_{GS}$ behavior of a representative NW p-MOSFET fabricated in accordance with an embodiment of the invention. The inset shows a logscale plot.
Figure 16B:
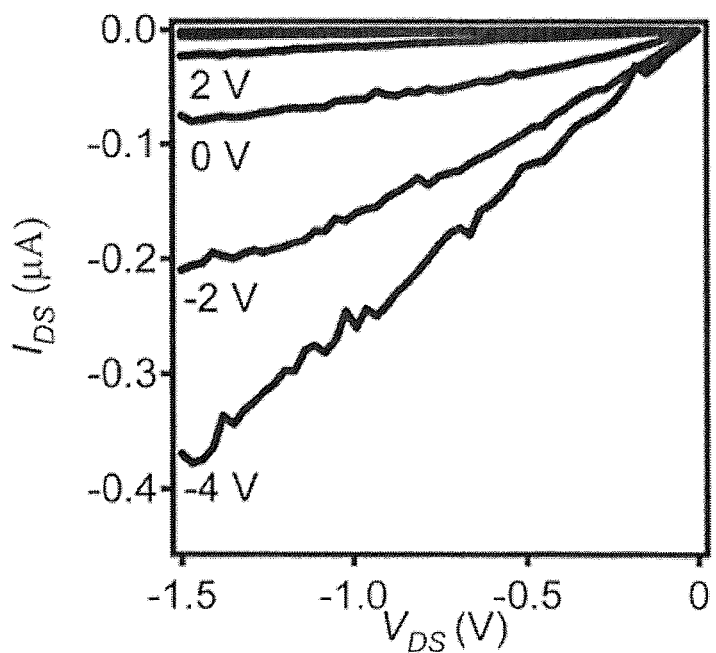
FIG. 16B shows a plot of the output characteristics of the NW p-MOSFET fabricated in accordance with an embodiment of the invention.
Figure 16C:
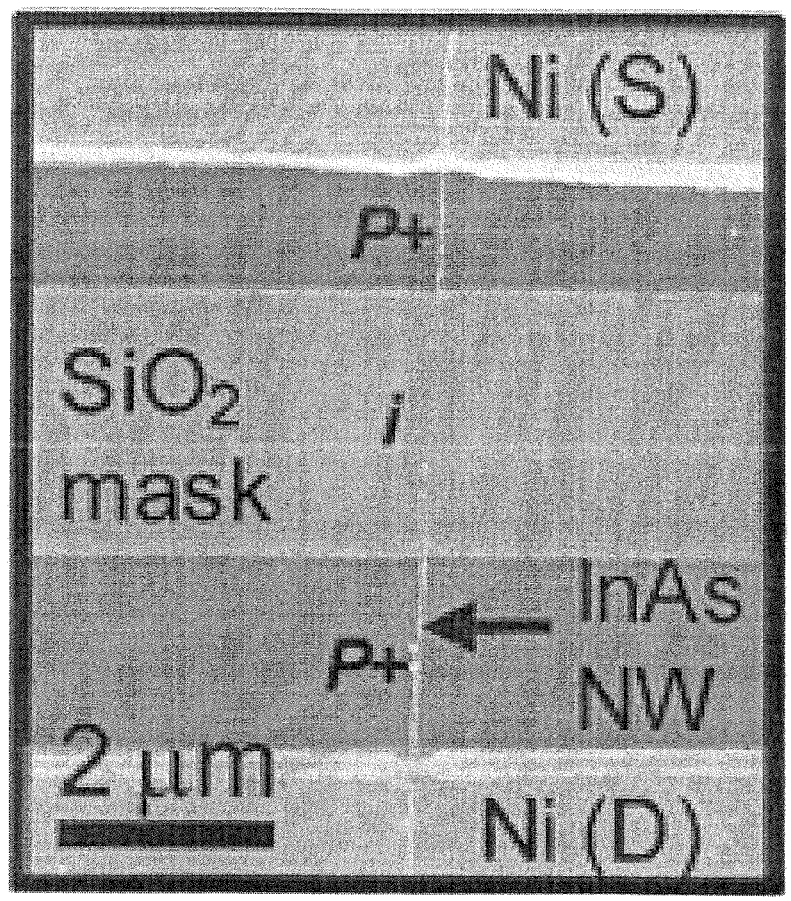
FIG. 16C shows a false-color SEM image of a representative NW p-MOSFET fabricated in accordance with an embodiment of the invention.
Figure 16D:
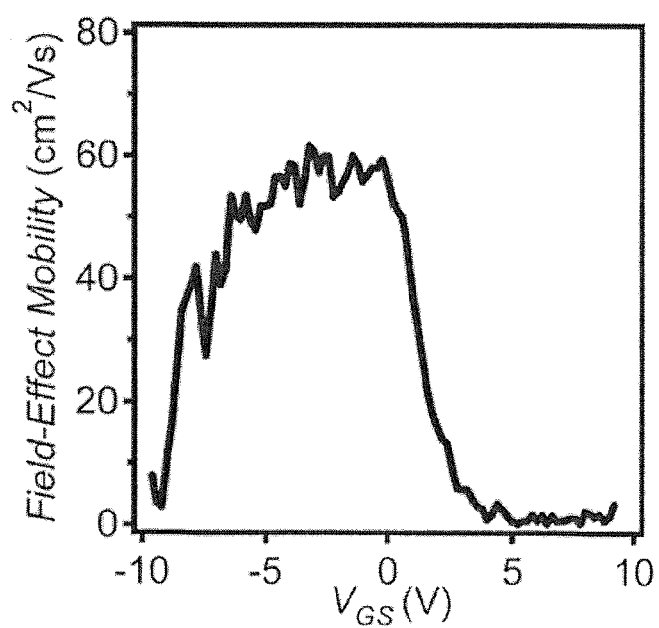
FIG. 16D shows a plot of hole field-effect mobility as a function of the back gate voltage for the NW p-MOSFET fabricated in accordance with an embodiment of the invention.

InAs NW p-MOSFETs were fabricated following the process illustrated in FIG. 4 and the doping conditions described with respect to Example 4. The I-V characteristics of a representative InAs NW p-MOSFET is shown in FIGS. 16A and 16B. The p-MOSFET has $I_{ON}$~0.17 µA and $I_{OFF}$~0.1 nA at $V_{DS}$=0.5V, with an $I_{ON}/I_{OFF}$>$10^3$. The threshold voltage $V_t$ is shifted to a positive voltage, likely as a result of fixed oxide and interface trapped charge states at the interface of the NW n-segment and the evaporated $SiO_2$ mask. An SEM image of a representative device is shown in FIG. 16C. The field-effect mobility as a function of $V_{Gs}$ is shown in FIG. 16D, with a peak hole mobility of ~60 cm²/Vs. The hole mobility for InAs NWs is significantly lower than the electron mobility as expected. This mobility is ~9× lower than the Hall mobility of ~450 cm²/Vs reported for lightly doped, p-type InAs bulk substrates. The difference may be due to surface scattering and contact resistance associated with the field-effect mobility extractions. The 1-V behavior of the patterned Zn-doped p-MOSFET is in distinct contrast to the behavior of the blank Zn-doped NW device shown in FIG. 11B, which exhibits minimal gate dependence. Furthermore, in contrast to the blank doped p⁺ NW devices where the entire doped NW serves as the "channel" material, the p-MOSFET exhibits a higher hole mobility (~2× higher) since the channel is undoped resulting in minimal impurity scattering. While InAs p-MOSFETs are not ideal devices due to the low hole mobility of InAs, the subject doping methods are versatile and effective for fabrication of complex device structures.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

What is claimed is:

1. A method of forming a compound semiconductor device, the method comprising:
    forming a monolayer of dopant atoms on a surface of a substrate comprising III-V semiconductor material by a self-limiting formation reaction of the dopant atoms;
    forming a capping layer on the monolayer of dopant atoms; and
    performing an annealing process to drive the dopant atoms of the monolayer of dopant atoms that are on the surface of the substrate and below the capping layer into the substrate to a desired junction depth in the III-V semiconductor material, wherein the junction depth formed in the III-V semiconductor material is within about 5 nm from a surface of the III-V semiconductor material;
    wherein the dopant atoms comprise sulfur (S) and the III-V semiconductor material comprises InAs, wherein forming the monolayer of dopant atoms on the surface of the substrate comprising the III-V semiconductor material comprises forming a monolayer of S on an InAs surface of the substrate.

2. The method according to claim 1, wherein forming the monolayer of dopant atoms on the surface of the substrate comprising the III-V semiconductor material comprises:
    performing a gas-phase process at a low temperature to form the monolayer of dopant atoms on the surface of III-V semiconductor material.

3. The method according to claim 1, wherein forming the capping layer on the monolayer of dopant atoms comprises forming an oxide on the monolayer of dopant atoms.

4. The method according to claim 1, further comprising doping the InAs with zinc (Zn) before forming the monolayer of S on the InAs surface of the substrate.

5. The method according to claim 4, further comprising forming a pattern mask on the substrate comprising the Zn-doped InAs to define well regions before forming the monolayer of S on the substrate,
    wherein the pattern mask covers portions of the substrate while allowing the monolayer of S to form on the well regions,
    wherein during the annealing process, the S is driven into the well regions, thereby forming n-type well regions in the substrate.

6. The method according to claim 1, wherein forming the monolayer of S on the InAs surface of the substrate comprises:
    disposing the substrate in an atomic layer deposition chamber to deposit the monolayer of S on the InAs surface.

7. The method according to claim 1, wherein forming the monolayer of S on the InAs surface of the substrate comprises:
    disposing the substrate in a bath of an ammonium sulfide solution with excess sulfur $((NH_4)_2S_x)$ at a temperature and for a time to allow a reaction between the $(NH_4)_2S_x$ and the InAs surface to faun the monolayer of S.

8. An InAs-based device comprising n-type regions formed according to the method of claim 7.

9. A method of forming a compound semiconductor device, the method comprising:
    forming a monolayer of dopant atoms on a surface of a substrate comprising III-V semiconductor material, wherein forming the monolayer of dopant atoms on the surface of the substrate comprising the III-V semiconductor material comprises:
    placing the substrate into a wet bath having a solution comprising the dopant, the solution capable of reacting with the III-V semiconductor material to attach the dopant to the substrate by a self-limiting formation reaction of the dopant atoms;

forming a capping layer on the monolayer of dopant atoms; and performing an annealing process to drive the dopant atoms of the monolayer of dopant atoms that are on the surface of the substrate and below the capping layer into the substrate to a desired junction depth in the III-V semiconductor material wherein the junction depth formed in the III-V semiconductor material is within about 5 nm from a surface of the III-V semiconductor material.

10. A III-V compound semiconductor device with impurity regions formed according to the method of claim 9.

11. A method of forming a compound semiconductor device, the method comprising:
introducing a dopant onto a surface of a compound semiconductor through a surface doping method; and
diffusing the dopant into the compound semiconductor;
wherein introducing the dopant onto the surface of the compound semiconductor through the surface doping method and diffusing the dopant into the compound semiconductor comprises:
forming a pattern mask on a substrate comprising III-V semiconductor material to define regions of the III-V semiconductor material for doping; and
exposing the substrate having the pattern mask, under heating conditions, to a gas-phase of a dopant atom to allow surface diffusion of the dopant at the defined regions for doping to a junction depth within about 5 nm from the surface of the compound semiconductor.

12. The method according to claim 11, further comprising:
forming III-V semiconductor nanowires on the substrate to provide the III-V semiconductor material, wherein the pattern mask defines regions of the III-V semiconductor nanowires for doping.

13. The method according to claim 11, wherein exposing the substrate having the pattern mask, under heating conditions, to the gas-phase of the dopant atom comprises disposing the substrate in a furnace with a source of the dopant atom.

14. A method of forming a compound semiconductor device, the method comprising:
introducing a dopant onto a surface of a compound semiconductor through a surface doping method; and
diffusing the dopant into the compound semiconductor;
wherein introducing the dopant onto the surface of the compound semiconductor through the surface doping method and diffusing the dopant into the compound semiconductor comprises:
forming a pattern mask on a substrate comprising III-V semiconductor material to define regions of the III-V semiconductor material for doping; and
exposing the substrate having the pattern mask, under heating conditions, to a gas-phase of a dopant atom to allow surface diffusion of the dopant at the defined regions for doping;
wherein the III-V semiconductor material comprises InAs and the dopant atom comprises zinc (Zn), wherein exposing the substrate having the pattern mask, under heating conditions, to the gas-phase of the dopant atom to allow surface diffusion of the dopant at the defined regions for doping comprises:
disposing the substrate in a furnace and using a solid Zn powder source to dope the defined regions of the InAs with Zn.

15. The method according to claim 14, further comprising forming InAs nanowires on the substrate, wherein the pattern mask defines regions of the InAs nanowires for doping.

16. An InAs-based device comprising p-type regions formed according to the method of claim 15.

17. An InAs-based device comprising p-type regions formed according to the method of claim 14.

* * * * *

UNITED STATES PATENT AND TRADEMARK OFFICE
CERTIFICATE OF CORRECTION

PATENT NO. : 8,697,467 B2
APPLICATION NO. : 12/843271
DATED : April 15, 2014
INVENTOR(S) : Ali Javey et al.

It is certified that error appears in the above-identified patent and that said Letters Patent is hereby corrected as shown below:

In the Specification

Column 2,
Lines 34-35, "MN semiconductor" should read --III-V semiconductor--.

Column 3,
Line 29, "$I_{DS}$-$U_{DS}$" should read --$I_{DS}$-$V_{DS}$--.

Column 4,
Line 23, "are fouled" should read --are formed--.

Column 5,
Line 22, "a p' InAs" should read --a $p^+$ InAs--.

Column 6,
Line 21, "be foamed" should read --be formed--.

Column 7,
Line 23, "The $(NH_4)_2S$, solution" should read --The $(NH_4)_2S_x$ solution--.

Column 8,
Line 60, "tilled states" should read --filled states--.

Column 9,
Line 47, "doped p'" should read --doped $p^+$--.
Line 51, "the p' InAs" should read --the $p^+$ InAs--.

Column 10,
Lines 32-33, "L 6-10 μm." should read --L = 6-10 μm--.

Signed and Sealed this
Seventh Day of October, 2014

Michelle K. Lee
*Deputy Director of the United States Patent and Trademark Office*

CERTIFICATE OF CORRECTION (continued)
U.S. Pat. No. 8,697,467 B2

Column 11,
Line 8, "lengths. L = 6-10 μm" should read --lengths, L = 6-10 μm--.
Line 43, "G 6×10$^{-7}$ S" should read --G ~ 6×10$^{-7}$ S--.
Line 45, "p and u" should read --ρ and μ--.

Column 12,
Line 29, "on Si substrates" should read --on p$^{+}$ Si substrates--.
Line 50, "$V_{BG} < 0$" should read --$V_{BG} \leq 0$--.

Column 13,
Line 30, "$V_{Gs}$" should read --$V_{GS}$--.
Line 37, "The 1-v behavior" should read --The I-V behavior--.

In the Claims

Column 14,
Line 56, "to faun" should read --to form--.